United States Patent [19]
Maya

[11] Patent Number: 5,459,098
[45] Date of Patent: Oct. 17, 1995

[54] MASKLESS LASER WRITING OF MICROSCOPIC METALLIC INTERCONNECTS

[75] Inventor: Leon Maya, Oak Ridge, Tenn.

[73] Assignee: Marietta Energy Systems, Inc., Oak Ridge, Tenn.

[21] Appl. No.: 962,811

[22] Filed: Oct. 19, 1992

[51] Int. Cl.[6] .......................... H01L 21/306; H01L 21/26
[52] U.S. Cl. .......................... 437/173; 437/935; 437/245
[58] Field of Search .................................. 437/173, 935; 148/DIG. 90, DIG. 93

[56] References Cited

U.S. PATENT DOCUMENTS

| | | |
|---|---|---|
| 4,339,285 | 7/1982 | Pankove . |
| 4,340,617 | 7/1982 | Deutsch et al. . |
| 4,372,989 | 2/1983 | Menzel . |
| 4,496,607 | 1/1985 | Mathias . |
| 4,574,095 | 4/1986 | Baum et al. . |
| 4,680,855 | 7/1987 | Yamazaki et al. . |
| 4,847,138 | 7/1989 | Boylan et al. . |
| 4,900,581 | 2/1990 | Stuke et al. . |
| 4,960,613 | 10/1990 | Cole et al. . |
| 5,145,741 | 9/1992 | Quick ........................ 437/173 |

FOREIGN PATENT DOCUMENTS 0029217  2/1991  Japan .

OTHER PUBLICATIONS

Levy, et al. "Low–Pressure Chemical Vapor Deposition of Wand Al for VLSI Appl." Mat. Res. Soc. Symp. Proc., vol. 71, Apr. 1986, pp. 229–247.

Bernhardt, et al., "Laser Microfabrication Technology and its Applications", Mat. Res. Soc. Symp. Proc., vol. 76, Dec. 1986, pp. 223–234.

Kirk–Othmer Encyclopedia of Chemical Technology, 3rd Edition, vol. 13, John Wiley & Sons, Inc. 1981 pp. 621–648.

Primary Examiner—George Fourson
Assistant Examiner—C. Everhart
Attorney, Agent, or Firm—Edward A. Pennington; Shelley A. Stafford; Harold W. Adams

[57] ABSTRACT

A method of forming a metal pattern on a substrate. The method includes depositing an insulative nitride film on a substrate and irradiating a laser beam onto the nitride film, thus decomposing the metal nitride into a metal constituent and a gaseous constituent, the metal constituent remaining in the nitride film as a conductive pattern.

14 Claims, 2 Drawing Sheets

MASKLESS LASER WRITING OF MICROSCOPIC METALLIC INTERCONNECTS

This invention was made with Government support under contract DE-AC05-84OR21400 awarded by the U.S. Department of Energy to Martin Marietta Energy Systems, Inc. and the Government has certain rights in this invention.

FIELD OF THE INVENTION

The present invention relates generally to the fabrication of integrated circuits and, more specifically, to a maskless laser writing technique for making microscopic metallic interconnects in an integrated circuit. Conventional photolithographic techniques are obviated by depositing a metal nitride film on a substrate and then patterning the film using an optically powered component which concentrates a laser beam impinging on the surface of the nitride film.

BACKGROUND OF THE INVENTION

Thin film deposition is a vital aspect of semiconductor manufacture. In order to produce an integrated circuit, thin films of various materials are used as barriers to the diffusion or implantation of impurity atoms, or as insulators between conductive materials and the silicon substrate. Typically, holes or windows are cut through the barrier material wherever impurity penetration or contact is required.

A mask is used to form the necessary pattern or windows or holes on the surface of the silicon substrate. The patterns are first transferred from the mask to a light-sensitive photoresist. Chemical or plasma etching is then used to transfer the pattern from the photoresist to the barrier material on the surface of the silicon substrate. Each mask step requires successful completion of numerous processing steps.

Metallization of electronic components, such as integrated circuits, to produce electrical contacts in integrated circuits is an important step in the manufacture of these devices. Metallizations are performed by depositing the metal uniformly followed by the forming of a pattern through the use of masking and etching steps. Existing technology involves the deposition of aluminum for MOS devices and PtSi, Ti, W, Au, and TiN for bipolar devices. The deposition is accomplished by evaporation of the metal or by sputtering of the more refractory materials.

Lasers have been used to form deposits by reacting with a vapor species which undergoes decomposition so as to deposit a metal on the substrate. U.S. Pat. No. 4,496,607 to Mathias describes a laser process for producing electrically conductive surfaces on insulators in which a laser beam is used to melt tracks onto a substrate. The tracks receive conductive particles to result in the formation of computer controlled patterns designed according to tracings characteristic of those used in circuit boards.

U.S. Pat. No. 4,372,989 to Menzel describes a method of producing metal and alloy films in which a laser beam is used to irradiate the surface of a metallic layer. The laser beam is used to change the metallic layer from amorphous to monocrystaline.

FIG. 1 is a schematic view of a prior art laser writing apparatus, as described in an article entitled "Laser Microfabrication Technology and Its Application to High Speed Interconnects of Gate Arrays" by Anthony F. Bernhardt, et al., *Materials Research Society Symposia Proceedings*, 76, 223–234 (1987). As seen in FIG. 1, an optical system 10 is used for scanning a focused argon-ion laser beam (514.5 Å) 12 emanating from a source 14 across a wafer 16. The wafer 16 is housed in a reaction vessel 18 into which reactant gases are introduced. A mirror 20 directs the beam 12 through a power modulator 22 and beam conditioning optics 24. Mirrors 26 and 28 then deflect the beam 12 to two acousto-optic crystals in deflector 30. These deflect the beam in orthogonal directions to allow short distance (0.5 mm) translation of the laser focus without mechanical moving elements.

Relay optics 32 image the deflected beam through a microscope objective 34, which passes the focused beam through a window 36 and into the reaction chamber 18. The objective 34 focuses the beam to an approximately one micron scanning spot on the wafer 16 within the roughly 500×500 micron scan field of the deflector 30. The reaction vessel 18 is mounted on a motorized X-Y stage 38, which is computer controlled, to move the wafer 16 between the 500 micron scan windows. During laser writing, the deposition and etching microreactions are followed through an optical microscope 40 and video camera 42.

Basically, the apparatus according to FIG. 1 is used in a system where the precursor is present as a species in the vapor phase above the substrate. The very high temperatures generated in a very small area cause deposition of either silicon or nickel. This type of laser writing through the pyrolysis of a vapor species is limited to very few systems. The particular system involving nickel carbonyl is not attractive because this chemical is very hazardous. Moreover, control of deposition parameters is more difficult when the precursor is in the vapor phase.

SUMMARY OF THE INVENTION

An object of the present invention is to provide a method of maskless laser writing which is capable of producing electronic components in integrated circuits.

Another object of the present invention is to provide a method of maskless laser writing which is capable of producing microscopic features on electronic devices.

Another object of the present invention is to provide a method of maskless laser writing which is capable of producing microscopic features on electronic devices without using conventional photolithographic steps of masking and etching to form wiring patterns.

These and other objects of the invention are met by providing a method of metallization of electronic components to produce electrical contacts in integrated circuits comprising the steps of depositing a nitride film on a substrate, and irradiating a laser beam onto the nitride film, thus decomposing the irradiated metal nitride into a metal pattern and a gaseous constituent.

Another aspect of the present invention is to provide an electronic device or component made according to the aforestated process.

Other objects, advantages and salient features of the invention will become apparent from the following detailed description, which taken in conjunction with the annexed drawings, discloses preferred embodiments of the invention.

DETAILED DESCRIPTION OF THE INVENTION

Figure 1:
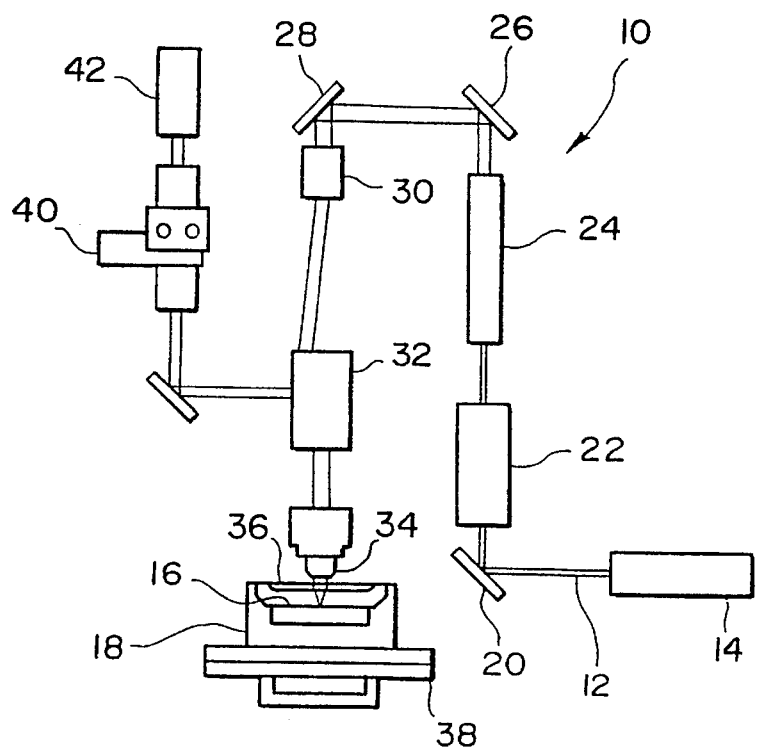
FIG. 1 is schematic view of a prior art laser writing apparatus.
Figure 2:
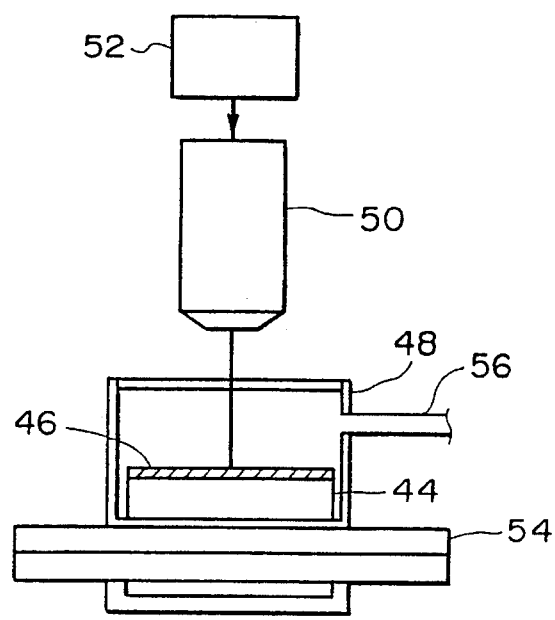
FIG. 2 is a schematic view of an apparatus capable of use in the method of the present invention.

The present invention is particularly suitable for silicon wafers which are coated with a thin film of an appropriate metallic nitride by a chemical vapor deposition or in a plasma activated deposition. Metallic nitrides capable of use are those with electrical conductivities characteristic of insulators or semiconductors which in addition show limited thermal stability and decompose into the constituent elements in the temperature range of 100° to 1000° C. Nitrides that can be used are those of, but not limited to, tin, copper, zinc, molybdenum, tungsten, cadmium, lead, and mercury. According to the present invention, the coated substrate is exposed to a laser beam to decompose the nitride selectively to generate microscopic features. The laser beam is a continuous wave laser having been concentrated by an optically powered lens system, such as an objective of a microscope. An example follows, with reference to FIG. 2:

EXAMPLE 1

A silicon wafer 44 is coated with a 0.8 micron thick film 46 of copper nitride. The film 46 if formed in a glow discharge system using a nitrogen plasma generated with a flow of 20 sccm of nitrogen. The pressure in the system is controlled at 2.85 torr with a vacuum system. The plasma is generated by passing 30 mA of current at 412 volts between a copper foil electrode and a stainless steel pedestal held at ground. Two quartz plates are placed on the stainless steel pedestal to hold the silicon wafer at about 5 mm from the copper electrode.

The coated wafer is then placed against the flat bottom of a vacuum cell 48 with the coated side facing a microscope objective 50 which has a 10X magnification. The cell 48 is provided with a conduit 56 which permits filling the interior chamber of the cell 48 with an inert gas or which permits creating a vacuum in the chamber. Either vacuum or inert gas is the preferred atmosphere for the method of the present invention.

Figure 4:
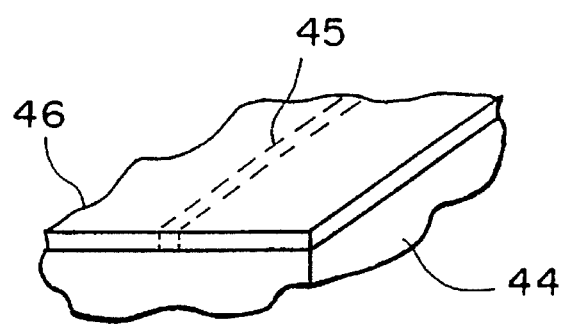
FIG. 4 is an enlarged, perspective view of the wafer of FIG. 2 after laser writing.

A continuous wave argon ion laser source 52 outputs a beam at 514 nm with a power level of 1.5 to 2.0 watts. Other lasers may be used, including pulsed lasers. The beam is concentrated by passage through the 10X microscope objective 50, which has a focal point about 7 mm from the lower end of the objective. The wafer 44 is positioned such that the focal point is on the surface of the nitride film 46. The cell 48 containing the wafer 44 is moved across the laser beam path laterally by means of a micrometer stage 54 or other suitable X-Y table device to effect precise, minute movements of the wafer 44 relative to the beam. This operation generates lines of about 5 microns in width and a few centimeters in length which show metallic conduction while the coated unaffected background shows a very high resistance. The metallic pattern can be seen in FIG. 4 as a line 45. The line is composed of the constituent metal and is thus conductive, while the area surrounding the line 45 is composed of the nitride film material and is thus insulative. The line width can be as small as 1–2 microns when using higher power objectives, such as a 60X objective. A 60X objective would have a closer focal point of about 3 mm.

When exposed to the concentrated laser beam, the film decomposes to produce nitrogen gas. The metal constituent remains in the film 46 where exposed to the laser beam, providing a conductive pattern in an otherwise insulative film or layer. This technique can thus be used form a variety of patterns in various electrical components, particularly in integrated circuits.

The interior of the cell 48 is kept in an inert atmosphere or at vacuum during maskless laser writing to avoid oxidation of the metal constituent.

Relative lateral motion can be imparted between the laser beam and the coated substrate either by moving the substrate as described above, or by moving the laser beam, or both.

EXAMPLE 2

Figure 3:
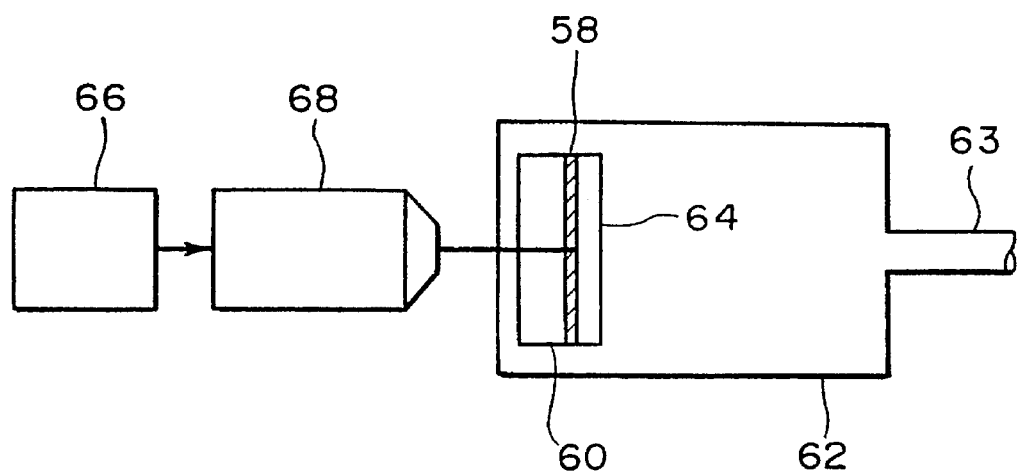
FIG. 3 is a schematic view of another apparatus capable of use in another embodiment of the present invention.

An alternative embodiment is illustrated in FIG. 3 for cases where the presence of unreacted metal nitrides in the substrate is not desired. In this embodiment, a nitride film 58 is formed by the process described with respect to Example 1, except that it is formed on a quartz plate 60. The coated quartz plate 60 is positioned inside a cell 62 in contact with a substrate or wafer 64 where metal patterns are to be formed by maskless laser writing. A conduit 63 is used to control the environment inside the cell 62 to provide either vacuum or inert gas.

A laser source 66, such as the argon ion laser described above, outputs a laser beam which passes through a microscope objective 68 to expose the assembly to a concentrated beam of laser light that strikes the quartz plate 60 from behind. The metal constituent is transferred to the substrate 64, which is silicon, after decomposition of the nitride film in which the nitrogen escapes as a gas.

This embodiment is prone to generate less resolution than the other embodiment, as the lines are a few times wider, due to the concentrated beam passing through the quartz plate 60. Laser writing can be accomplished by moving either the cell 62 relative to the beam, or visa versa.

In the embodiments described above, the substrate was made of silicon. However, sapphire or quartz can be used as well, particularly for copper nitride. Also, although copper nitride was described as the nitride film, tin nitride can be deposited using a tin metal foil electrode in the glow discharge assembly. Tin nitride coatings can also be generated in a CVD reactor consisting of a tube with two zones, one for evaporation of tetrakis diethylamino tin held at 150° C. and one for deposition of tin nitride films on a variety of substrates held at 300° C. The deposition zone is maintained under an atmosphere of ammonia to facilitate the decomposition.

Use of the present invention can be extended to alloys of the aforementioned elements. Coating can be made on different substrates such as GaAs or InP. Metallizations via laser writing as described can be followed by selective electro-chemical gold deposition on the metal interconnects. This might be useful under certain circumstances. The coating of nitride unaffected by the laser can be used as a dielectric or utilized as a semiconductor. Band gaps are in eV 0.23 for $Cu_3N$, 0.09 for $Zn_3N_2$ and 3.5 for $Sn_3N_4$.

The present invention will improve the productivity of electronic device fabrication and offer new possibilities for the design of different devices. The coating of nitride unaffected by the laser can be used as a dielectric or utilized as a semiconductor.

In the embodiments described herein, the optical device used to concentrate the laser beam is a microscope objective having a power of 10.

Other devices can be used, with powers in the range of 2 to 60. As the power increases, the line width decreases, but the focal length also becomes shorter. This creates practical problems at powers greater than 60X, where the focal length is about 3 mm., due to the fact that the beam has to pass through a widow of the cell 48 (FIG. 2) and 62 (FIG. 3).

While advantageous embodiments have been chosen to illustrate the invention, it will be understood by those skilled in the art that various changes and modifications can be made therein without departing from the scope of the invention as defined in the appended claims.

What is claimed is:

1. A method of forming a metal pattern on a substrate comprising the steps of:

depositing an insulative nitride film on a substrate; and irradiating a laser beam onto the nitride film, thus decomposing the metal nitride into a metal constituent and a gaseous constituent, the metal constituent remaining on the substrate as a conductive pattern, wherein the nitride film has a decomposition temperature range of between 100° and 1000° C.

2. A method according to claim 1, further comprising moving the substrate relative to the laser beam while irradiating the laser beam so as to shape the conductive pattern.

3. A method according to claim 1, wherein the metal constituent of the nitride film is selected from the group consisting of tin, copper, zinc, molybdenum, tungsten, cadmium, lead, and mercury.

4. A method according to claim 3, wherein the metal pattern has a width of about 1 micron.

5. A method according to claim 1, wherein the depositing step comprises a glow discharge deposition method using a nitrogen plasma.

6. A coated, patterned substrate made according to the method of claim 1.

7. A method according to claim 1, further comprising concentrating the laser beam by passing the laser beam through a magnifying optical device prior to irradiating the nitride film.

8. A method according to claim 7, wherein the optical device is a microscope objective having a power between 2 and 60.

9. A method of forming a metal pattern on a substrate comprising the steps of:

depositing a metal nitride film on a plate made of transparent material:

positioning the metal nitride film in contact with a substrate within a cell; and irradiating a laser beam onto the nitride film through the plate, thus decomposing the metal nitride into a metal constituent and a gaseous constituent, the metal constituent being deposited on the substrate as a conductive pattern, wherein the nitride film has a decomposition temperature range of between 100° and 1000° C.

10. A method according to claim 9, further comprising moving the substrate and plate in unison relative to the laser beam to shape the metal pattern.

11. A method according to claim 9, wherein the metal constituent of the nitride film is selected from the group consisting of tin, copper, zinc, molybdenum, tungsten, cadmium, lead, and mercury.

12. A coated, patterned substrate made according to the method of claim 9.

13. A method according to claim 9, further comprising concentrating the laser beam by passing the laser beam through a magnifying optical device prior to irradiating the nitride film.

14. A method according to claim 9, wherein the plate is made from a material selected from the group consisting of quartz and sapphire.

* * * * *